United States Patent
Chandra

(10) Patent No.: US 8,836,548 B1
(45) Date of Patent: Sep. 16, 2014

(54) METHOD AND SYSTEM FOR DATA COMPRESSION AT A STORAGE SYSTEM

(71) Applicant: EMC Corporation, Hopkinton, MA (US)

(72) Inventor: Surendar Chandra, Sunnyvale, CA (US)

(73) Assignee: EMC Corporation, Hopkinton, MA (US)

( * ) Notice: Subject to any disclaimer, the term of this patent is extended or adjusted under 35 U.S.C. 154(b) by 0 days.

(21) Appl. No.: 14/098,213

(22) Filed: Dec. 5, 2013

(51) Int. Cl.
*H03M 7/00* (2006.01)
*H03M 7/30* (2006.01)
*G06F 17/30* (2006.01)
*G11B 20/14* (2006.01)
*H03M 7/40* (2006.01)

(52) U.S. Cl.
CPC ........... *H03M 7/30* (2013.01); *G06F 17/30864* (2013.01); *G11B 20/1419* (2013.01); *H03M 7/00* (2013.01); *G06F 17/30011* (2013.01); *H03M 7/40* (2013.01)
USPC .............................................. 341/60; 341/50

(58) Field of Classification Search
CPC ...... H03M 7/30; H03M 7/40; G11B 20/1419; G06F 17/30011; G06F 17/30864
USPC ........... 341/60, 50, 52, 65; 707/693, 638, 722
See application file for complete search history.

(56) References Cited

U.S. PATENT DOCUMENTS 6,427,140 B1 * 7/2002 Ginter et al. .................... 705/80

OTHER PUBLICATIONS

Moses Charikar, "Format Identification for Fragmented Byte Aligned Integer Image", U.S. Appl. No. 61/691,737, filed Aug. 21, 2012, 20 pages.
Moses Charikar, "Format Identification for Fragmented Byte Non-aligned Integer", U.S. Appl. No. 61/691,740, filed Aug. 21, 2012, 24 pages.
Moses Charikar, "Lossless Compression of Fragmented Integer Image Data", U.S. Appl. No. 61/691,735, filed Aug. 21, 2012, 26 pages.

* cited by examiner

*Primary Examiner* — Joseph Lauture
(74) *Attorney, Agent, or Firm* — Blakely Sokoloff Taylor & Zafman LLP

(57) ABSTRACT

A computer-implemented method for compressing data is disclosed. The method starts with determining a way to read a received data block in its native endian format of at a storage system, where the data block contains a set of data and the determination is based on sampling a subset from a set of data and checking variation of the values. The method selects a base value for the data block based on the determined way to read the data block and generates a set of updated data, where each value of the set of updated data corresponds to the base value and an original value. The method separates each data within the set of updated data into two portions with different bit-value distribution patterns and compresses one portion with a first algorithm while compresses another portion with a second algorithm different from the first.

22 Claims, 8 Drawing Sheets

Original Data Block 302

Differential Data Block 304

1 → 0000000000000001
-1 → 1111111111111111

Data Stored in Complement Form 312

1 → <0000000000000001>, <+>
-1 → <0000000000000001>, <->

Data Stored in <value>, <sign> Form 314

US 8,836,548 B1

METHOD AND SYSTEM FOR DATA COMPRESSION AT A STORAGE SYSTEM

FIELD OF THE INVENTION

Embodiments of the present invention relate generally to data storage systems. More particularly, embodiments of the invention relate to compressing data at a storage device.

BACKGROUND

Image data is an important format of data in a variety of applications. Image data are generally large in size and they are challenging to store, replicate, and back up at a storage system. Particularly, deploying an application-specific compression algorithm in a general-purpose storage system is complicated.

First, there are multiple layers of indirection between the application and the underlying storage system. Maintaining image intelligence, boundaries, and semantics is difficult especially when multiple users are writing image data to the same storage system. Even in a storage system dedicated to image data, there are other system metadata such as directory, file, and object information to be stored. Second, data compression has detrimental impact on system performance. Thus, compression method or system needs to be fast, efficient, and do not require knowledge of the image parameters to be suitable for image data compression for a storage system.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
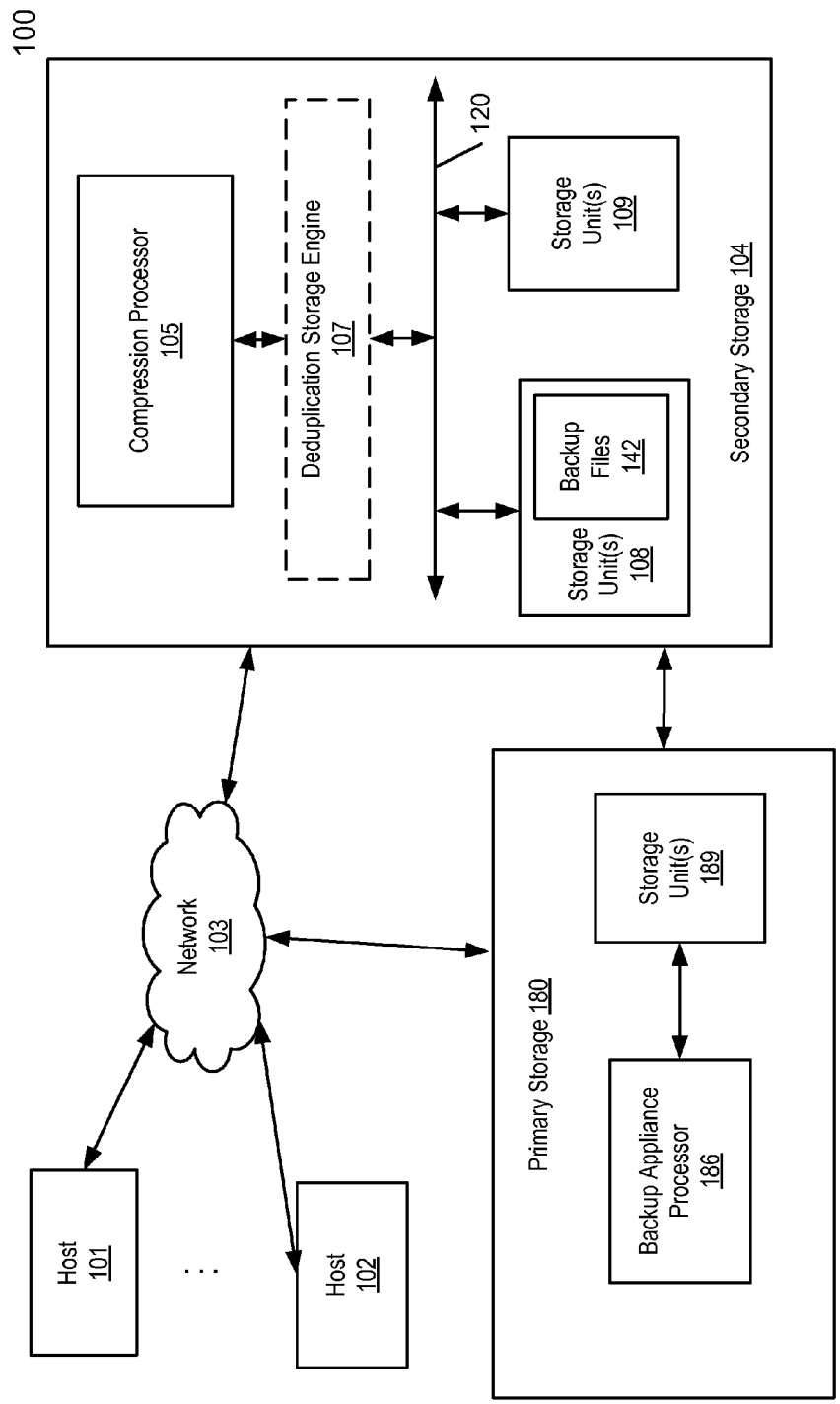
FIG. 1 is a block diagram illustrating a system for backup according to one embodiment of the invention.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

In the following description and claims, the terms "coupled" and "connected," along with their derivatives, may be used. It should be understood that these terms are not intended as synonyms for each other. "Coupled" is used to indicate that two or more elements, which may or may not be in direct physical or electrical contact with each other, co-operate or interact with each other. "Connected" is used to indicate the establishment of communication between two or more elements that are coupled with each other. A "set," as used herein refers to any positive whole number of items including one item.

According to some embodiments, a computer-implemented method can be utilized to compress data. The method starts with determining a native endian format of a received data block at a storage system, where the data block contains a set of data and the determination is based on sampling a subset of data and checking variation of the values. The method selects a base value for the data block based on the native endian format of the data block and generates a set of updated data, where each value of the set of updated data corresponds to the base value and an original value. The method separates each data within the set of updated data into different categories or bit distribution patterns such as slow changing and fast changing portions and compresses the set of updated data. When data is changing slowly, the difference between a data value and its neighboring data values are small. Data of different categories may be compressed using different data compression algorithms. In one embodiment, the slow changing portion of each data is compressed with a first algorithm and the fast changing portion is compressed with a second algorithm, where the first algorithm is different from the second algorithm.

According to some embodiments, the data compression may be performed within a storage system, such as a backup storage system for backing up data (e.g., image data). The storage system contains a compression logic or processor, which includes an endian format determinator, a differential data generator, and a data compressor. The endian format determinator is configured to determine a native endian format of a received data block at the storage system, where the data block contains a set of data, and where the determination is based on sampling a subset of data and checking variation of values of the subset of data. The set of data is then sent to the differential data generator. The differential data generator is configured to select a base value for the data block based on the native endian format of the data block, and it is further configured to generate a set of updated data, where each value of data within the set of the updated data corresponds to the base value and an original value of the set of data. The generated data is then sent to the data compressor. The data compressor is configured to separate each data within the set of updated data into a slow changing portion and a fast changing portion. The data compressor is further configured to compress the set of updated data. The slow changing portion of each data is compressed with a first algorithm and the fast changing portion is compressed with a second algorithm, where the first algorithm is different from the second algorithm.

FIG. 1 is a block diagram illustrating a system for backup according to one embodiment of the invention. Referring to FIG. 1, system 100 includes, but is not limited to, one or more hosts 101-102 communicatively coupled to primary storage 180 and secondary storage 104 over network 103. Hosts 101-102 may be any type of hosts such as a server, a personal computer (e.g., desktops, laptops, and tablets), a "thin" client, a personal digital assistant (PDA), a Web enabled system, a gaming device, a media player, or a mobile phone (e.g., Smartphone), etc. Network 103 may be any type of network such as a local area network (LAN), a wide area network (WAN) such as Internet, a corporate intranet, a metropolitan area network (MAN), a storage area network (SAN), a bus, or a combination thereof, wired and/or wireless.

Both primary and secondary storage systems 180 and 104 may include any type of server or cluster of servers (e.g., cloud server). For example, they may be storage servers used for any of various different purposes, such as to provide multiple users with access to shared data and/or to back up mission critical data. They may be, for example, a file server (e.g., an appliance used to provide network attached storage (NAS) capability), a block-based storage server (e.g., used to provide storage area network (SAN) capability), a unified storage device (e.g., one which combines NAS and SAN capabilities), a nearline storage device, a direct attached storage (DAS) device, a tape backup device, or essentially any other type of data storage device. Both primary and secondary storage systems 180 and 104 may have a distributed architecture, or all of their components may be integrated into a single unit. Both primary and secondary storage systems 180 and 104 may be implemented as part of an archive and/or backup storage system such as a de-duplication storage system available from EMC® Corporation of Hopkinton, Mass.

In one embodiment, primary storage 180 includes a backup appliance processor 186. Backup appliance processor 186 coordinates with primary storage 180, secondary storage 104, and hosts 101/102 to run various backup and restoration operations including replication. Backup appliance processor 186 may coordinate both backup and restoration operations. In one embodiment, backup appliance processor 186 coordinates backup and restoration operations between hosts 101/102 and primary storage 180, where the data from hosts 101/102 are backed up to and restored from storage units 189. In another embodiment, backup appliance processor 186 coordinates backup and restoration operations between primary storage 180 and secondary storage 104, where the data from storage units 189 of primary storage 180 are backed up to storage units 108-109 at secondary storage 104 (sometimes primary storage 180 and secondary storage 104 are referred to as cascaded storages). Note while backup appliance processor 186 is illustrated within primary storage 180 in FIG. 1, in some embodiments, backup appliance processor 186 is embedded within secondary storage 104 or it is embedded within a standalone backup appliance server that communicatively coupled with primary storage 180 and secondary storage 104.

Both primary storage 180 and secondary storage 104 may perform deduplication. The deduplication processes performed and storage units allocated are similar between primary storage 180 and secondary storage 104, thus only the processes and storage units within one of them are disclosed below for illustration. In one embodiment, secondary storage 104 may include, but is not limited to, deduplication storage engine 107, and one or more storage units 108-109 communicatively coupled to each other. Storage units 108-109 may be implemented locally (e.g., single node operating environment) or remotely (e.g., multi-node operating environment) via interconnect 120, which may be a bus, a fabric, and/or a network. In one embodiment, one of the storage units 108-109 operates as an active storage to receive and store external or fresh user data, while the other storage unit operates as a target storage unit to periodically archive data from the active storage unit according to an archiving policy or scheme. Storage units 108-109 may be, for example, conventional magnetic disks, optical disks such as CD-ROM or DVD based storage, magnetic tape storage, magneto-optical (MO) storage media, solid state disks, flash memory based devices, or any other type of non-volatile storage devices suitable for storing large volumes of data. Storage units 108-109 may also be combinations of such devices. In the case of disk storage media, the storage units 108-109 may be organized into one or more volumes of Redundant Array of Inexpensive Disks (RAID). Backup files 142 represent data stored in storage units 108.

In response to a data file to be stored in storage units 108-109, compression processor 105 compresses receiving data blocks. The compressed data blocks are then stored. In one embodiment, the data blocks go to deduplication storage engine 107. Deduplication storage engine 107 is configured to segment the data file into multiple chunks (also referred to as segments) according to a variety of segmentation policies or rules. Deduplication storage engine 107 may choose not to store a chunk in a storage unit if the chunk has been previously stored in the storage unit. In the event that deduplication storage engine 107 chooses not to store the chunk in the storage unit, it stores metadata enabling the reconstruction of the file using the previously stored chunk. As a result, chunks of data files are stored in a deduplicated manner, either within each of storage units 108-109 or across at least some of storage units 108-109. The metadata, such as metadata 110-111, may be stored in at least some of storage units 108-109, such that files can be accessed independent of another storage unit. Metadata of each storage unit includes enough information to provide access to the files it contains. Note while compression processor 105 is illustrated in storage system 104, in some embodiment, compression processor 105 is implemented in primary storage 180.

Figure 2A:
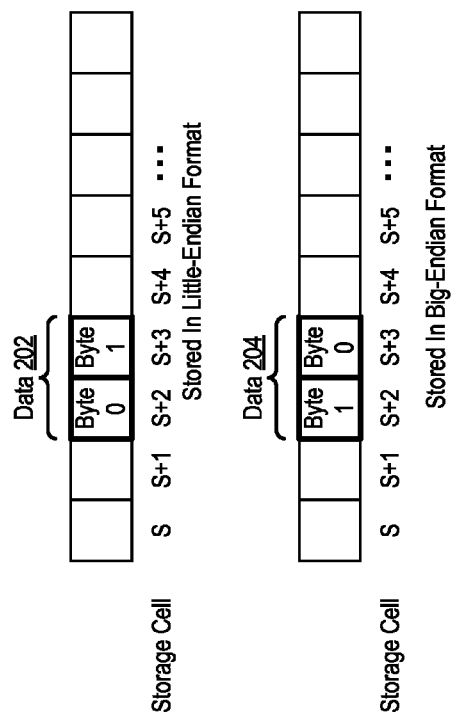
FIG. 2A illustrates examples of data stored in little-endian and big-endian formats.

Incoming data to compression processor 105 may be in a little-endian format or a big-endian format. Endianness refers to how bytes of a data word are ordered in a storage cell. FIG. 2A illustrates examples of data stored in little-endian and big-endian formats. In a little-endian format, data are stored with the least significant byte being stored in the smallest address. For example, data 202 contains two bytes, bytes 0 and 1. In a storage cell addresses ordered from the smallest (S) to the largest (S+5), data 202 is stored in a little-endian format, thus the least significant byte, byte 0, is stored the first while the most significant byte, byte 1, is stored the second. In contrast, in a big-endian format, data are stored with the most significant byte being stored in the smallest address. Data 204 is stored in a big-endian format, thus the most significant byte, byte 1, is stored the first while the least significant byte, byte 0, is stored the second. Data are referred to as being stored in their native endian format when they are stored in the endian format as they were generated. Compression processor 105 may not be aware of the endian format of data when they arrive. Even the information is available to compression processor 105, the native endian format may not be the endian format of data coming to compression processor 105 as the data may have gone through multiple stages of processing.

Thus, embodiments of the invention propose ways for compression processor 105 to identify the native endian format of data block.

One observation is that for certain data, such as medical image data, block values change slowly from one data unit to a next data unit. Since the data values change slowly between adjacent data units, one may sample some adjacent data units of a data block, and find a measurement of variation of these adjacent data units. If the correct endian format is selected, the measurement should be smaller than the one when a wrong endian format is selected.

Figure 2B:
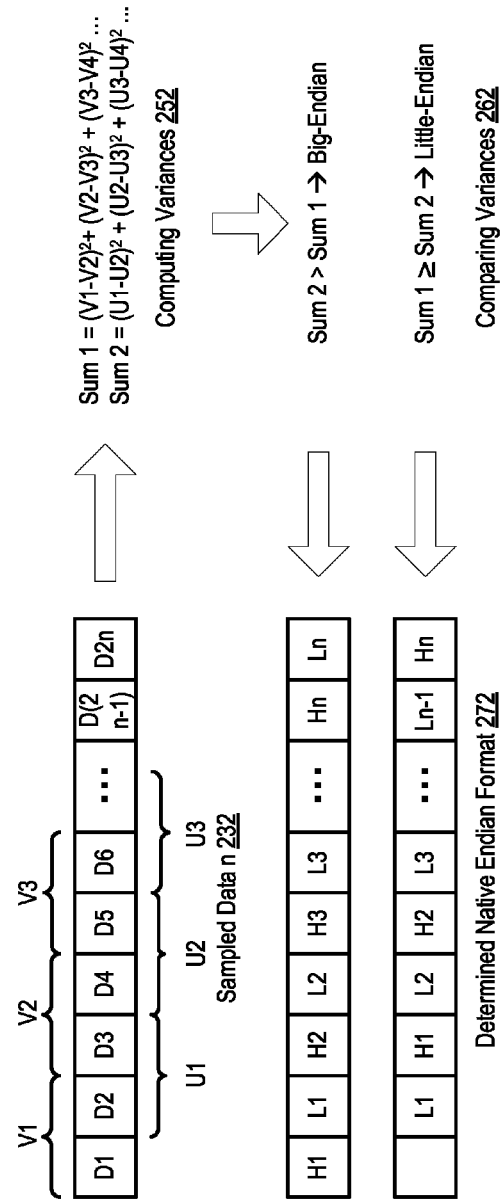
FIG. 2B illustrates the process of finding the native endian format according to one embodiment.

FIG. 2B illustrates the process of finding the native endian format according to one embodiment. Referring to FIG. 2B, a series of n consecutive data units is selected from a received data block. Each data unit contains at least two bytes, thus a sample of a length of 2n bytes is selected at reference 232. Since each data unit contains two bytes, one may derive a first sum of differences by reading two consecutive bytes as a data unit such as V1, V2, and V3, and finding a square of difference between every two consecutive data units. Then one may derive a second sum of differences by bit-shifting 8 bits (thus shifting by one byte), reading two consecutive bytes as a data unit such as U1, U2, and U3, and finding a square of difference between every two newly assumed consecutive data units. Since each data unit is either in a big-endian or little-endian format, one of the readings is in the data units' native endian format, in which case the sum of differences should be small, thus smaller than the reading not in the data units' native endian format. The two sums of differences are then compared at reference 262. Note the two sums should contain the same number of differences to make the two sums comparable. When the first sum is smaller than the second sum, the first reading is to read in the data's native endian format, otherwise data starting from the second byte is in the native endian format.

For example, considering a set of three 16-bit hexadecimal sample data of 7102, 7132 and 71F2. If the sample data comes in a little endian format, they would be stored as "02 71 32 71 F2 71." That is, D1=02, D2=71, D3=32, D4=71, D5=F2, and D6=71 at reference 232 of FIG. 2B. If compression processor 105 is a part of a little-endian machine, V1=7102, V2=7132, and V3=71F2, while U1=3271, U2=F271, U3=XX71 (XX denotes a value not shown in FIG. 2B). Using the method discussed, since sum 1 is smaller, compression processor 105 determines to read the block's native endian format starting at V1. In contrast, if compression processor 105 is a part of a big-endian machine, V1=0271, V2=3271, V3=F271, while U1=7132, U2=71F2, U3=71XX. Since sum 2 is smaller, compression processor 105 determines to read the block's native endian format starting at U1.

Note only one of the readings reads in data unit's native format, which displays the characteristics that values of adjacent data units change slowly. The other reading reads data unit in the reverse order, since the lower order bits changes more randomly (not slowly), the sum of differences tends to be bigger. In the example given in the preceding paragraph, even though one of the reading does not read the data value as stored (i.e., when the compression processor 105 is a part of a big-endian machine reading the data coming in the little-endian format), the characteristics of changing slowly hold true because the higher-order bits change slowly than the lower-order bits, no matter whether or not the higher-order bits and lower-order bits are originally stored as two parts of a single data value. In one embodiment, for data units in 16-bits format and data blocks at 4 kilobytes, sampling of 64 consecutive bytes is sufficient to correctly determine the native endian format.

Note the square of difference between two data units is only one measurement of variation of values of the two data units, and other measurement of variation of values can be implemented too. The method may also use other ways to sample adjacent data units, e.g., sampling every other data unit or sampling via another determined measure of adjacency. In addition, the method is not limited to two byte data units, other larger data units with more bytes may also take advantage of the method, where the bit shift may still with 8 bits but more sums of variances need to compared and the reading yields the smallest variance tends to be the reading of the native endian format.

Data displaying the characteristics of values of adjacent data units changing slowly can be found in many applications. For example, medical image captured in 16-bit high-resolution grayscale format, high-resolution pictures and video captured in digital camera stored in 16-bit or higher high-resolution format. For these application, identifying the native endian format, regardless how the data were stored prior to coming to a compression process (the data may be stored in non-native endian format to achieve higher throughput without loss of storing efficiency), is useful for the compression process.

Once the native endian format is determined, a compression processor may further process a received data block. One insight is that since adjacent data units change slowly, using a base value and a differential value to represent data units achieves a better compression efficiency. Note the for the purpose of illustration, a byte or data of 8 bits is utilized as an example of a data unit. However, a data unit of other sizes, such as 16-bit, 32-bit, and 64-bit, etc., may also be utilized.

Figure 3A:
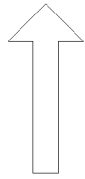
FIG. 3A illustrates the process of deriving a base value and differential values for a data block according to one embodiment of the invention.

FIG. 3A illustrates the process of deriving a base value and differential values for a data block according to one embodiment of the invention. The original data block 302 has 9 data units. One may use the value of the first data unit (value of 568) of the data block as a base value, and record a delta value between the base value and data value of every other data units for every other data unit. The resulting data block at reference 304 is one type of differential data block. This type of differential data block has the first data unit recorded as its original value while the other data units record only a differential value from the base value. Because the other data units have smaller values after the differential computation comparing to their original values, storing these updated values take less storage space thus storage efficiency is achieved. Another type of differential data block has the first data unit recorded as its original value and the all following data unit record only a differential value from the previous value. The resulting data block at reference 306 illustrates the other type of differential data block, where each data unit after the first data unit is recorded as a differential value from the immediately previous value.

The value of the first data unit ("first value") is chosen for the base value in the embodiment illustrated in FIG. 4A. Using the first value for a data block does not require buffering the data block for differential computation, and data units can be serially processed. In other embodiments, the base value can be selected as the median value or the average value of a data block. In those embodiments, the other data units in the differential data block (the updated data block) may have even lower values thus better for compression.

Note the transformation is reversible, and one may revert back from a differential data block to its corresponding original data block without any loss of information. Such transformation is lossless, and the data compression using such transformation may be referred to as lossless compression.

Lossless compression is used widely in application such as processing medical images that require lossless compression per regulation.

Figure 3B:
FIG. 3B illustrates formats of two's complement form and two-tuple form to store data block values according to one embodiment of the invention.

Differential data blocks are distributed around the base value, and it contains both positive and negative data values (e.g., representing offsets from the base value) as illustrated at reference 304 in FIG. 3A. In a traditional storage system, positive values are stored in its binary values while negative values are natively stored in two's complement form. This storing form has room for improvement in achieving compression efficiency. FIG. 3B illustrates formats of two's complement form and two-tuple form to store data block values according to one embodiment of the invention.

At reference 312, the 16-bit+1 value is stored as 0000, 0000,0000,0001 while the 16 bit −1 value is stored as 1111, 1111,1111,1111 in two complement form. The latter value may be considered having value in each bit position thus compression is harder. Instead of two's complement form, embodiments of the invention propose a two-tuple form to store data value block as illustrated at reference 314. Thus the 16-bit+1 value and −1 value are stored in as the same 0000, 0000,0000,0001, and since only one bit position contains value, it is easier to compress.

In one experiment on the transformation of medical images, it is observed that in differential data blocks, 30% of data units have value of zero while about 15% of the data units have value of either +1 or −1. Thus, in applications such as this, the two-tuple form may offer significant compression efficiency.

With the native endian format being identified and data unit values being stored in a two-tuple form, one may compress the data units according to the updated data unit blocks. The rationale behind it is that in the updated data unit blocks, the higher order bits change slowly while the lower order bits change fast. Thus one may take advantage of the difference in change and compress the updated data blocks using different compressing algorithms for data having different characteristics such as higher order and lower order bits.

Figure 4:
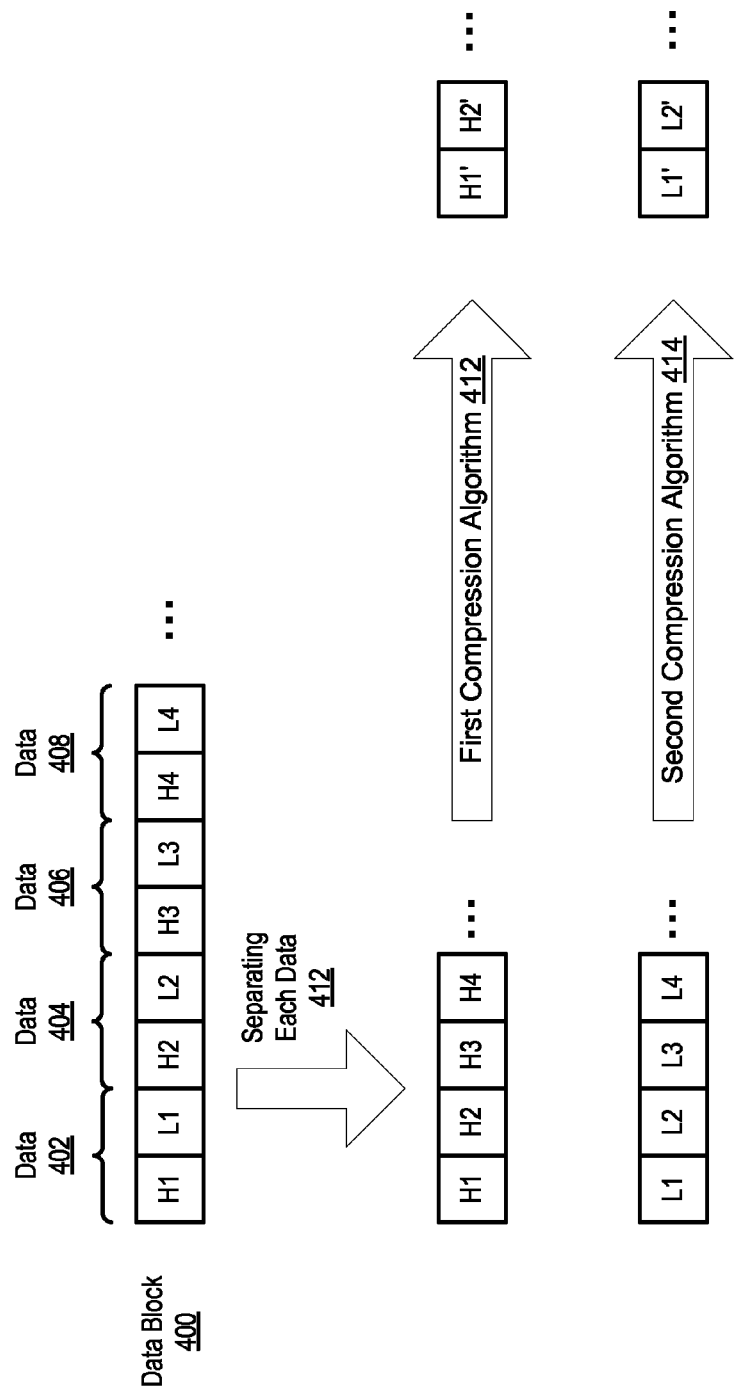
FIG. 4 illustrates a two-pronged compression process according to one embodiment of the invention.

FIG. 4 illustrates a two-pronged compression process according to one embodiment of the invention. Data block 400 contains data units such as data 402-408, where each data unit contains a high order bit portion (denoted with "H") and a low order bit portion (denoted with "L"). In one embodiment, the high and low order bit portions contain equal number of bits. For example, for data unit of 16 bits, 8 bits each are split into the high and low order bits. In other embodiment, the high and low order bit portions contain different number of bits.

The high order bits are grouped together and these bits are compressed through a first compressing algorithm at reference 412. Similarly, the low order bits are grouped together and those bits are compressed through a second compressing algorithm at reference 414. The compressed data are then stored and can be restored back by a lossless transformation.

A compression algorithm suitable for slow changing values (the first algorithm above) can be one of a variety of compression algorithms such as a run-length algorithm. A run-length algorithm (sometime referred to as run-length encoding or compressing algorithm, the two terms are used interchangeably in the specification) is a known algorithm where runs of data (that is, sequences in which the same data value occurs in many consecutive data elements) are stored in a single value and count, rather than the original run.

A compression algorithm suitable for fast changing values (the second algorithm above) can also be one of a variety of compression algorithms such as a deflate algorithm. A deflate algorithm is also a known algorithm that uses a combination of LZ77 (proposed by Abraham Lempel in 1977) algorithm and Huffman coding (an entropy encoding algorithm proposed by David A. Huffman in 1952). The embodiments of the invention compress high order and low order bits separately using different algorithms, and a person in the ordinary skill of art know other algorithms that also work well for fast changing and slow changing values respectively.

While the compression techniques disclosed herein are reversible thus they can be used in lossless compression, they may be utilized for compression processes introducing loss too. These compression techniques, singly or in combination, result in enhanced data compression results in a variety of applications.

Figure 5:
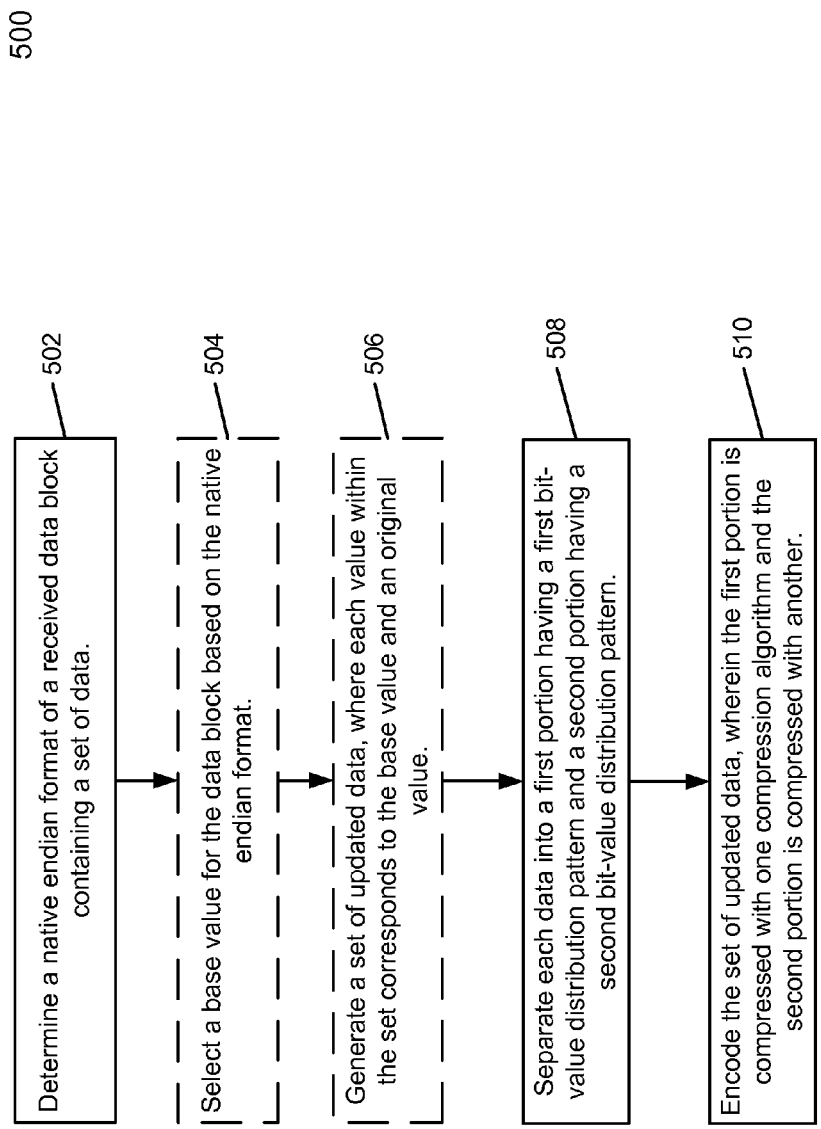
FIG. 5 illustrates a method of supporting data compression according to one embodiment of the invention.
Figure 7:
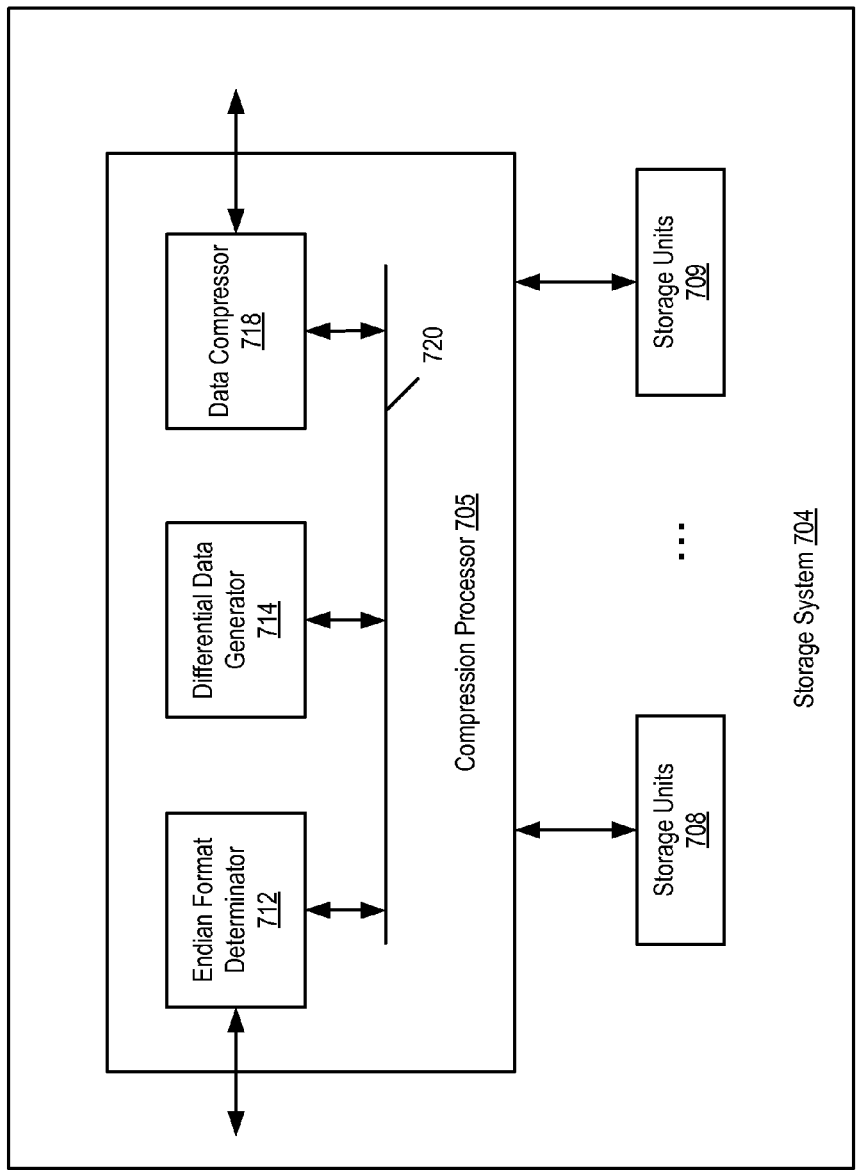
FIG. 7 illustrates a storage system containing a compression processor for supporting data compression according to one embodiment of the invention.

FIG. 5 illustrates a method of supporting data compression according to one embodiment of the invention. Method 500 may be implemented at a compression processor (which may include software, hardware, or a combination thereof) such as illustrated in FIGS. 1 and 7 and they may be utilized in either a primary or a secondary storage system.

Method 500 starts with determining a way to read a received data block in its native endian format, where the data block contains a set of data at reference 502. The determination is based on sampling a subset of data within the data block and checking variation of the subset of data. As discussed herein, the variation of the subset of data can be determined differently in different embodiments. In one embodiment, the variation of the subset of data is measured by the square of difference between two data in a presumed native endian format.

After the way to read the received data block in its native endian format is determined, the compression processor may optionally (illustrated as a dotted block) selects a base value for the data block based on the determined way to read the data block at reference 504. The base value for the data block is the value of first data of the set of data within the data block in one embodiment. The base value for the data block may also be the value of an average value or a median value of the set of data within the data block in embodiments.

Then optionally at reference 506, a set of updated data is generated, where each value of data within the set of updated data corresponds to the base value and an original value of the set of data. While the base value is the value of first data of the set of data (or the average value or the median value of the set of data), in one embodiment, all the value within the set of updated data equal to the difference between the original value and base value except the first data, which contains the base value; in an alternative embodiment, all the value within the set of updated data equal to the difference between the original value and immediately previous value as illustrated at reference 306 of FIG. 3.

In one embodiment, each of the set of updated data is stored as an absolute value of data and a sign indicating the data being positive or negative.

At reference 508, the compression processor separates each data within the set of updated data into two portions with the way to read the received data block being determined, where a first portion has a first bit-value distribution pattern and a second portion has a second bit-value distribution pattern. In one embodiment, the first portion is a portion with bit-value changing slowly and the second portion is a portion with bit-value changing fast. When data is changing slowly, the difference between a data value and its neighboring data values are small, and the characteristics can thus be explored in compression. In one embodiment, each data is divided into two equal lengths of bits, where the high order bits are in one portion and the low order bits are in the other portion.

At reference 508, the first portion is compressed with one compression algorithm and the second portion is compressed with another compression algorithm, where the first algorithm is different from the second algorithm. In one embodiment, the former algorithm is a run-length compression algorithm. In one embodiment, the latter algorithm is a deflate compression algorithm.

Figure 6:
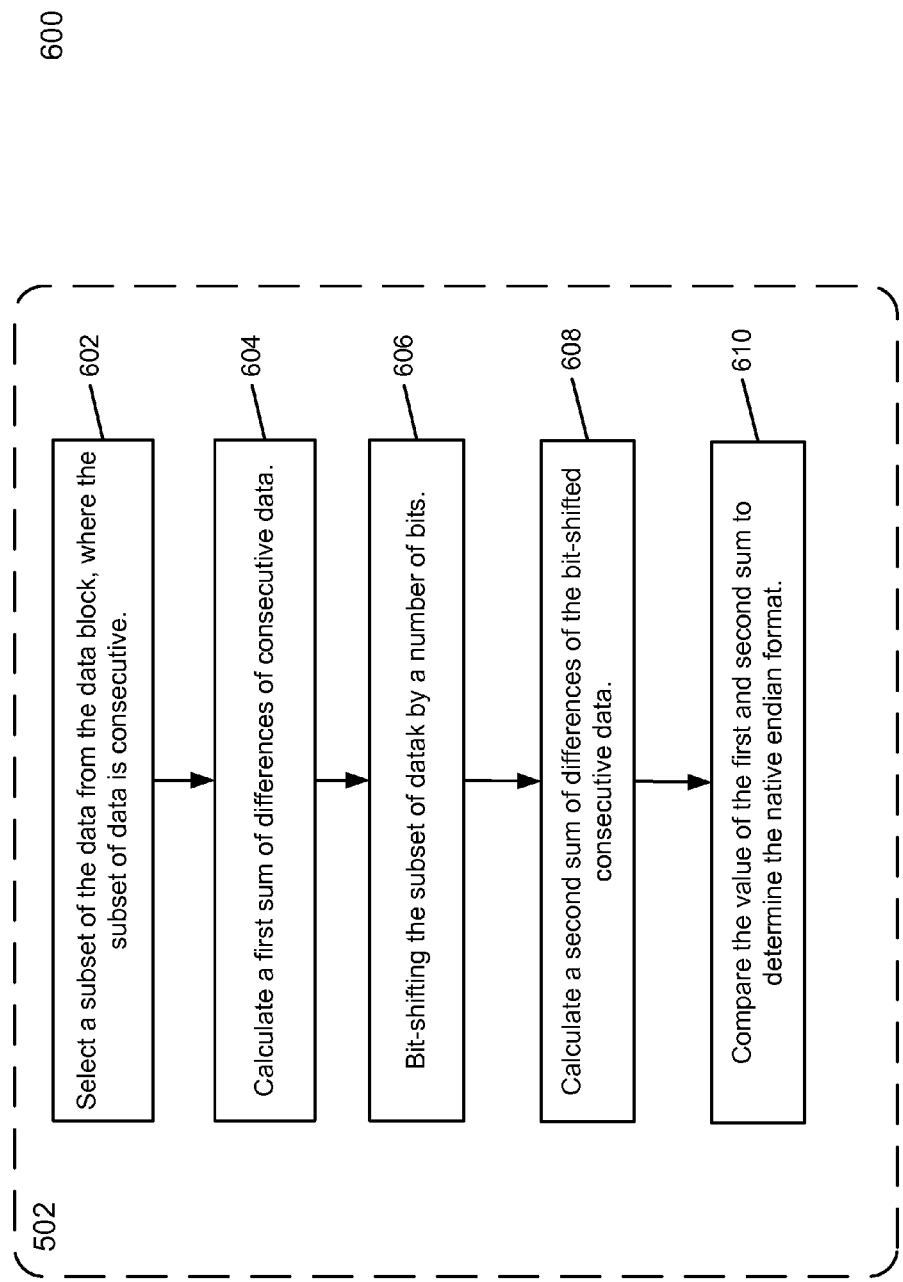
FIG. 6 illustrates a method of determining a native endian format of a data block according to one embodiment of the invention.

FIG. 6 illustrates a method of determining the way to read a received data block in its native endian format according to one embodiment of the invention. In one embodiment, method 600 is implemented as being included in step illustrated at reference 502 (illustrated as dotted block) of FIG. 5. Method 600 may be implemented at a compression processor such as illustrated in FIGS. 1 and 7 and they may be utilized in either a primary or a secondary storage system. A data block containing a set of data is received at a compression processor at the beginning of method 600. The data of the set contain two or more bytes.

At reference 602, the compression processor selects a subset of the data block, where the subset of data is consecutive data. Then at reference 604, the compression processor calculates a first sum of differences of consecutive data of the subset. At reference 606, the compression processor bit-shifts the subset of data by a number of bits. In one embodiment, the subset of data is bit-shifted by 8 bits when the data are stored in 16-bits values.

Then at reference 608, the compression processor calculates a second sum of differences of the bit-shifted consecutive data. Then the values of the first sum and second sum are compared to determine the way to read the data block in its native endian format.

FIG. 7 illustrates a storage system containing a compression processor for supporting data compression according to one embodiment of the invention. FIG. 7 is similar to a portion of FIG. 1, and same or similar references indicate elements or components having the same or similar functionalities.

Compression processor 705 contains endian format determinator 712, differential data generator 714, and data compressor 718. These various modules can be implemented as a single unit or multiple units, the unit or units integrate various modules and perform similar function as the modules of compression processor 705, and these modules can be implemented in software, hardware or a combination thereof. Some modules illustrated in FIG. 7 may be implemented outside of compression processor 705 but communicatively coupled with compression processor 705. In addition, some modules illustrated as outside of compression processor 705 may be implemented within compression processor 705.

In one embodiment, endian format determinator 712 is configured to determine a way to read a received data block in its native endian format at storage system 704, where the data block contains a set of data, and where the determination is based on sampling a subset of data and checking variation of values of the subset of data. In one embodiment, the determination is performed through method 600 illustrated in FIG. 6.

After the way to read the data block in its native endian format is determined, in one embodiment, differential data generator 714 is configured to select a base value for the data block based on the native endian format of the data block. The differential data generator is further configured to generate a set of updated data to the data block, wherein each value of data within the set of the updated data corresponds to the base value and an original value of the set of data. In one embodiment, the base value is the value of the first data of the set of data. In another embodiment, the base value is one of the values of the average value or the median value of the set of data. In one embodiment, each of the generated set of updated data is stored as an absolute value of data and a sign indicating the data being positive or negative.

The generated set of updated data is then compressed by a data compressor 718, which is configured to separate each data within the set of updated data into a first portion of data having a first bit-value distribution pattern and a second portion of data having a second bit-value distribution pattern based on the determined way to read the received data block. In one embodiment, the first and second bit-value portions are a slow changing portion and a fast changing portion respectively, and it compresses the slow changing portion of each data with a first algorithm and the fast changing portion of each data with a second algorithm.

In one embodiment, separating each data comprises dividing each data into two equal lengths of bits, where high order bits are in one portion and low order bits are in the other portion. In one embodiment, the first algorithm is a run-length compression algorithm. In one embodiment, the second algorithm is a deflate compression algorithm.

Figure 8:
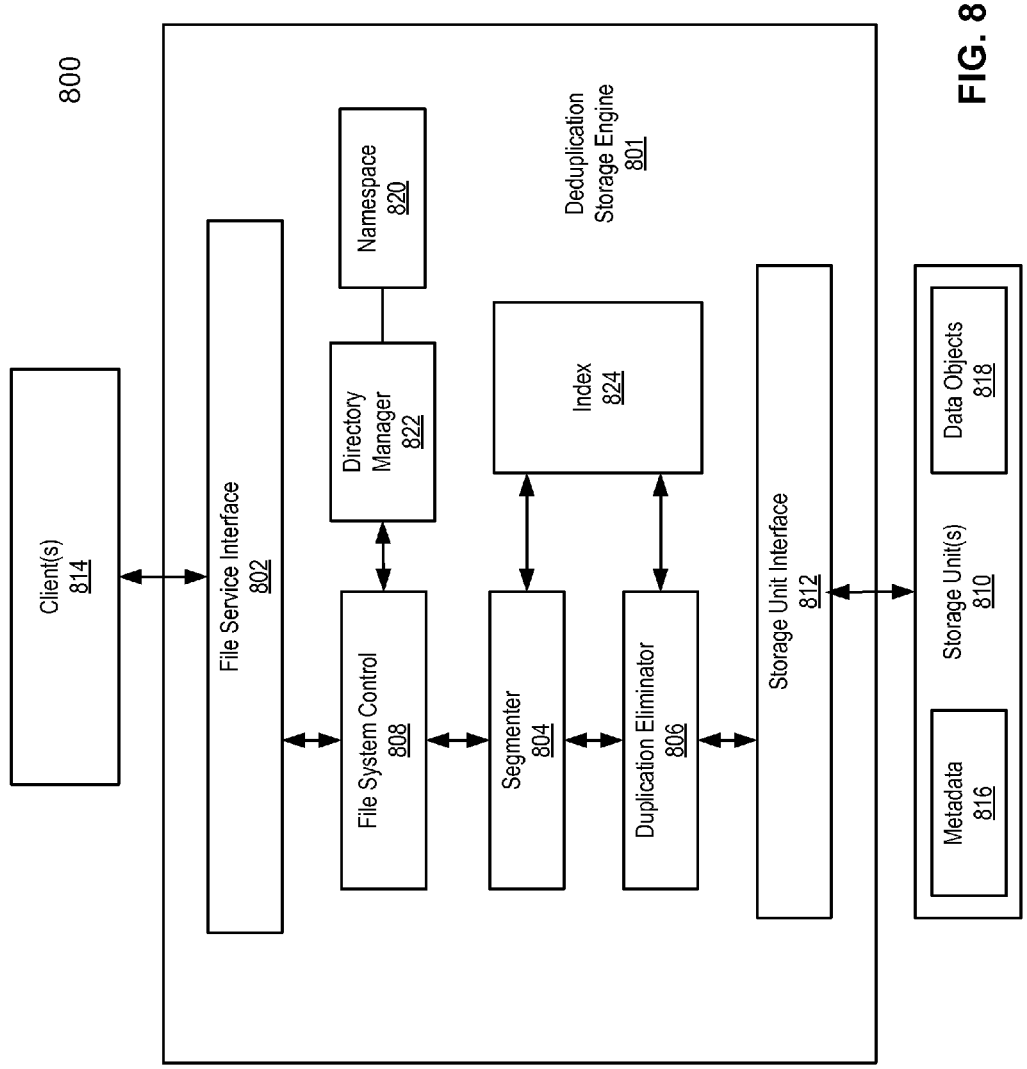
FIG. 8 is a block diagram illustrating a deduplicated storage system according to one embodiment of the invention.

Data compression may be integrated with deduplication. FIG. 8 is a block diagram illustrating a deduplication storage system according to one embodiment of the invention. For example, deduplication storage system 800 may be implemented as part of a deduplication storage system as described above, such as, for example, the deduplication storage system as a client and/or a server as shown in FIG. 1. In one embodiment, storage system 800 may represent a file server (e.g., an appliance used to provide network attached storage (NAS) capability), a block-based storage server (e.g., used to provide storage area network (SAN) capability), a unified storage device (e.g., one which combines NAS and SAN capabilities), a near-line storage device, a direct attached storage (DAS) device, a tape backup device, or essentially any other type of data storage device. Storage system 800 may have a distributed architecture, or all of its components may be integrated into a single unit. Storage system 800 may be implemented as part of an archive and/or backup system such as a deduplicating storage system available from EMC® Corporation of Hopkinton, Mass.

In one embodiment, storage system 800 includes a deduplication engine 801 interfacing one or more clients 814 with one or more storage units 810 storing metadata 816 and data objects 818. Clients 814 may be any kinds of clients, such as, for example, a client application, backup software, or a garbage collector, located locally or remotely over a network. A network may be any type of networks such as a local area network (LAN), a wide area network (WAN) such as the Internet, a corporate intranet, a metropolitan area network (MAN), a storage area network (SAN), a bus, or a combination thereof, wired and/or wireless.

Storage devices or units 810 may be implemented locally (e.g., single node operating environment) or remotely (e.g., multi-node operating environment) via an interconnect, which may be a bus and/or a network (e.g., a storage network). In one embodiment, one of storage units 810 operates as an active storage to receive and store external or fresh user data from a client (e.g., an end-user client or a primary storage system associated with one or more end-user clients), while the another one of storage units 810 operates as a target storage unit to periodically archive data from the active storage unit according to an archiving policy or scheme. Storage units 810 may be, for example, conventional magnetic disks, optical disks such as CD-ROM or DVD based storage, magnetic tape storage, magneto-optical (MO) storage media, solid state disks, flash memory based devices, or any other type of non-volatile storage devices suitable for storing large volumes of data. Storage units 810 may also be combinations of such devices. In the case of disk storage media, the storage units 810 may be organized into one or more volumes of redundant array of inexpensive disks (RAID). Data stored in the storage units may be stored in a compressed form (e.g., lossless compression: HUFFMAN coding, LEMPEL-ZIV WELCH coding; delta encoding: a reference to a chunk plus a difference; etc.). In one embodiment, different storage units may use different compression methods (e.g., main or active storage unit from other storage units, one storage unit from another storage unit, etc.).

The metadata, such as metadata 816, may be stored in at least some of storage units 810, such that files can be accessed independent of another storage unit. Metadata of each storage unit includes enough information to provide access to the files it contains. In one embodiment, metadata may include fingerprints contained within data objects 818, where a data object may represent a data chunk, a compression region (CR) of one or more data chunks, or a container of one or more CRs. Fingerprints are mapped to a particular data object via metadata 816, enabling the system to identify the location of the data object containing a data chunk represented by a particular fingerprint. A fingerprint may be generated based on at least a portion of a data chunk, for example, by applying a predetermined mathematical algorithm (e.g., hash function) to at least a portion of the content of the data chunk. When an active storage unit fails, metadata contained in another storage unit may be utilized to recover the active storage unit. When one storage unit is unavailable (e.g., the storage unit has failed, or is being upgraded, etc.), the system remains up to provide access to any file not stored in the failed storage unit. When a file is deleted, the metadata associated with the files in the system is updated to reflect that the file has been deleted.

In one embodiment, metadata 816 may include a file name, a storage unit identifier (ID) identifying a storage unit in which the chunks associated with the file name are stored, reconstruction information for the file using the chunks, and any other appropriate metadata information. Metadata 816 may further include a chunk ID, a chunk sketch, a hash of a chunk, an encrypted hash of a chunk, random data, or any other appropriate metadata. In some embodiments, metadata associated with a chunk is used to identify identical and/or similar data segments. The stored metadata enables a faster identification of identical and/or similar data chunks as an ID and/or sketch (e.g., a set of values characterizing the chunk) do not need to be recomputed for the evaluation of a given incoming data segment.

In one embodiment, a chunk ID includes one or more deterministic functions of a data chunk, one or more hash functions of a data chunk, random data, or any other appropriate data chunk ID. In various embodiments, a data chunk sketch includes one or more deterministic functions of a data chunk, one or more hash functions of a data chunk, one or more functions that return the same or similar value for the same or similar data chunks (e.g., a function that probably or likely returns a same value for a similar data segment), or any other appropriate data segment sketch. In various embodiments, sketch function values are determined to be similar using one or more of the following methods: numeric difference, hamming difference, locality-sensitive hashing, nearest-neighbor-search, other statistical methods, or any other appropriate methods of determining similarity. In one embodiment, sketch data includes one or more data patterns characterizing a chunk. For example, a sketch may be generated by applying one or more functions (e.g., hash functions) on a chunk and a subset of the results of the functions performed on the chunk (e.g., a number of results, for example the ten lowest results or the ten highest results) are selected as a sketch.

In one embodiment, a copy of the metadata is stored on a storage unit for files stored on a storage unit so that files that are stored on the storage unit can be accessed using only the information stored on the storage unit. In one embodiment, a main set of metadata information can be reconstructed by using information of other storage units associated with the storage system in the event that the main metadata is lost, corrupted, damaged, etc. Metadata for a storage unit can be reconstructed using metadata information stored on a main storage unit or other storage unit (e.g., replica storage unit). Metadata information further includes index information (e.g., location information for chunks in storage units, identifying specific data objects).

In one embodiment, deduplication storage engine 801 includes file service interface 802, segmenter 804, duplicate eliminator 806, file system control 808, and storage unit interface 812. Deduplication storage engine 801 receives a file or files (or data item(s)) via file service interface 802, which may be part of a file system namespace 820 of a file system associated with the deduplication storage engine 801. The file system namespace 820 refers to the way files are identified and organized in the system. An example is to organize the files hierarchically into directories or folders, which may be managed by directory manager 822. File service interface 812 supports a variety of protocols, including a network file system (NFS), a common Internet file system (CIFS), and a virtual tape library interface (VTL), etc.

The file(s) is/are processed by segmenter 804 and file system control 808. Segmenter 804, also referred to as a content store, breaks the file(s) into variable-length chunks based on a variety of rules or considerations. For example, the file(s) may be broken into chunks by identifying chunk boundaries. Chunk boundaries may be determined using file boundaries, directory boundaries, byte counts, content-based boundaries (e.g., when a hash of data in a window is equal to a value), or any other appropriate method of determining a boundary. Reconstruction of a data block, data stream, file, or directory includes using one or more references to the one or more chunks that originally made up a data block, data stream, file, or directory that was/were previously stored.

In some embodiments, chunks are segmented by identifying chunk boundaries that are content-based—for example, a hash function is applied to values of data within a sliding window through the data stream or block and when the hash function is equal to a value (or equal to one of several values) then a chunk boundary is identified. In various embodiments, chunk boundaries are identified using content based functions operating on windows within a data stream or block that have a minimum or maximum or other value or any other appropriate content based chunking algorithm. In various embodiments, chunks include fixed-length chunks, variable length chunks, overlapping chunks, non-overlapping chunks, chunks with a minimum size, chunks with a maximum size, or any other appropriate chunks. In various embodiments, chunks include files, groups of files, directories, a portion of a file, a portion of a data stream with one or more boundaries unrelated to file and/or directory boundaries, or any other appropriate chunk.

In one embodiment, file system control 808, also referred to as a file system manager, processes information to indicate the chunk(s) association with a file. In some embodiments, a list of fingerprints is used to indicate chunk(s) associated with a file. File system control 808 passes chunk association information (e.g., representative data such as a fingerprint) to index 824. Index 824 is used to locate stored chunks in storage units 810 via storage unit interface 812. Duplicate eliminator 806, also referred to as a segment store, identifies whether a newly received chunk has already been stored in storage units 810. In the event that a chunk has already been stored in storage unit(s), a reference to the previously stored chunk is stored, for example, in a chunk tree associated with the file, instead of storing the newly received chunk. A chunk tree of a file may include one or more nodes and each node represents or references one of the deduplicated chunks stored in storage units 810 that make up the file. Chunks are then packed by a container manager (which may be implemented as part of storage unit interface 812) into one or more storage containers stored in storage units 810. The deduplicated chunks may be further compressed into one or more CRs using a variation of compression algorithms, such as a Lempel-Ziv algorithm before being stored. A container may contain one or more CRs and each CR may contain one or more deduplicated chunks (also referred to deduplicated segments). A container may further contain the metadata such as fingerprints, sketches, type of the data chunks, etc. that are associated with the data chunks stored therein.

When a file is to be retrieved, file service interface 802 is configured to communicate with file system control 808 to identify appropriate chunks stored in storage units 810 via storage unit interface 812. Storage unit interface 812 may be implemented as part of a container manager. File system control 808 communicates (e.g., via segmenter 804) with index 824 to locate appropriate chunks stored in storage units via storage unit interface 812. Appropriate chunks are retrieved from the associated containers via the container manager and are used to construct the requested file. The file is provided via interface 802 in response to the request. In one embodiment, file system control 808 utilizes a tree (e.g., a chunk tree obtained from namespace 820) of content-based identifiers (e.g., fingerprints) to associate a file with data chunks and their locations in storage unit(s). In the event that a chunk associated with a given file or file changes, the content-based identifiers will change and the changes will ripple from the bottom to the top of the tree associated with the file efficiently since the appropriate content-based identifiers are easily identified using the tree structure. Note that some or all of the components as shown as part of deduplication engine 801 may be implemented in software (e.g., executable code executed in a memory by a processor), hardware (e.g., processor(s)), or a combination thereof. For example, deduplication engine 801 may be implemented in a form of executable instructions that can be stored in a machine-readable storage medium, where the instructions can be executed in a memory by a processor.

In one embodiment, storage system 800 may be used as a tier of storage in a storage hierarchy that comprises other tiers of storage. One or more tiers of storage in this hierarchy may utilize different kinds of storage devices and/or may be optimized for different characteristics such as random update performance. Files are periodically moved among the tiers based on data management policies to achieve a cost-effective match to the current storage requirements of the files. For example, a file may initially be stored in a tier of storage that offers high performance for reads and writes. As the file ages, it may be moved into a tier of storage according to one embodiment of the invention. In various embodiments, tiers include different storage technologies (e.g., tape, hard drives, semiconductor-based memories, optical drives, etc.), different locations (e.g., local computer storage, local network storage, remote network storage, distributed storage, cloud storage, archive storage, vault storage, etc.), or any other appropriate storage for a tiered data storage system.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the invention also relate to an apparatus for performing the operations herein. Such a computer program is stored in a non-transitory computer readable medium. A machine-readable medium includes any mechanism for storing information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices).

The processes or methods depicted in the preceding figures may be performed by processing logic that comprises hardware (e.g. circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

Embodiments of the present invention are not described with reference to any particular programming language. It will be appreciated that a variety of programming languages may be used to implement the teachings of embodiments of the invention as described herein.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:
1. A computer-implemented method comprising:
  determining a way to read a received data block in its native endian format at a storage system, by sampling a subset from a set of data contained in the data block and checking variation of values of the subset of data;
  separating each data contained in the data block into a first portion of data having a first bit-value distribution pat- tern and a second portion of data having a second bit-value distribution pattern based on the determined way to read the data block; and compressing the first portion using a first compression algorithm and compressing the second portion using a second compression algorithm that is different from the first compression algorithm.

2. The computer-implemented method of claim 1, wherein determining the way to read the data block in its native endian format comprising:
  selecting the subset from the set of data, wherein the subset of data is consecutive;
  calculating a first sum of differences of consecutive data;
  bit-shifting the subset of data by a number of bits;
  calculating a second sum of differences of the bit-shifted consecutive data; and
  comparing the value of the first and second sum of differences to determine the native endian format.

3. The computer-implemented method of claim 1, further comprising:
  after the way to read the data block in its native endian format is determined and prior to separating each data contained in the data block,
  selecting a base value for the data block based on the determined way to read the data block; and
  generating a set of updated data to the data block from the data contained in the data block, wherein each value of the data corresponds to the base value and an original value of the set of data.

4. The computer-implemented method of claim 1, wherein selecting the base value for the data block comprising selecting the base value to be one of:
  a value of first data of the set of data;
  an average value of the set of data; and
  a median value of the set of data.

5. The computer-implemented method of claim 1, wherein each data contained in the data block is stored as an absolute value of data and a sign indicating the data being positive or negative.

6. The computer-implemented method of claim 1, wherein separating each data comprising dividing each data into two equal lengths of bits, and wherein high order bits are in one portion and low order bits are in the other portion.

7. The computer-implemented method of claim 1, wherein the first compressing algorithm is a run-length compression algorithm.

8. The computer-implemented method of claim 1, wherein the second compressing algorithm is a deflate compression algorithm.

9. A storage system, comprising:
  a compression processor for compressing data, the compression processor including:
  an endian format determinator configured to determine a way to read a received data block in its native endian format of at the storage system by sampling a subset from a set of data contained in the data block and checking variation of values of the subset of data; and
  a data compressor configured to separate each data contained in the data block into a first portion of data having a first bit-value distribution pattern and a second portion of data having a second bit-value distribution pattern based on the determined way to read the data block;
  the data compressor further configured to compress first portion using a first algorithm and compressing the second portion using a second compression algorithm that is different from the first compression algorithm.

10. The storage system of claim 9, wherein the endian format determinator determines the way to read the data block in its native endian format through:
  selecting the subset from the set of data, wherein the subset of data is consecutive;
  calculating a first sum of differences of consecutive data;
  bit-shifting the subset of data by a number of bits;
  calculating a second sum of differences of the bit-shifted consecutive data; and
  comparing the value of the first and second sum of differences to determine the native endian format.

11. The storage system of claim 10, further comprising a differential data generator configured to select a base value for the data block based on the determined way to read the data block, the differential data generator further configured to generate a set of updated data to the data block from the data contained in the data block, wherein each value of the data within the set of the updated data corresponds to the base value and an original value of the set of data.

12. The storage system of claim 9, wherein the differential data generator selects the base value for the data block to be one of:
  a value of first data of the set of data;
  an average value of the set of data; and
  a median value of the set of data.

13. The storage system of claim 9, wherein the first compression algorithm is a run-length compression algorithm.

14. The storage system of claim 9, wherein the second compression algorithm is a deflate compression algorithm.

15. The storage system of claim 9, wherein the storage system is a deduplicating storage system.

16. A non-transitory computer-readable medium having instructions stored therein, which when executed by a processor, cause the processor to perform operations, the operations comprising:
  determining a way to read a received data block in its native endian format of at a storage system by sampling a subset from a set of data contained in the data block and checking variation of values of the subset of data;
  separating each data contained in the data block into a first portion of data having a first bit-value distribution pattern and a second portion of data having a second bit-value distribution pattern based on the determined way to read the data block; and
  compressing the first portion using a first compression algorithm and compressing the second portion using a second compression algorithm that is different from the first compression algorithm.

17. The non-transitory machine-readable medium of claim 16, wherein determining the way to read the data block in its native endian format comprising:
  selecting a subset from the set of data, wherein the subset of data is consecutive;
  calculating a first sum of differences of consecutive data;
  bit-shifting the subset of data by a number of bits;
  calculating a second sum of differences of the bit-shifted consecutive data; and
  comparing the value of the first and second sum of differences to determine the native endian format.

18. The non-transitory machine-readable medium of claim 16, further comprising:
  after the way to read the data block in its native endian format is determined and prior to separating each data contained in the data block,
  selecting a base value for the data block based on the determined way to read the data block; and generating a set of updated data to the data block from the data contained in the data block, wherein each value of the data corresponds to the base value and an original value of the set of data.

19. The non-transitory machine-readable medium of claim 16, wherein each data contained in the data block is stored as an absolute value of data and a sign indicating the data being positive or negative.

20. The non-transitory machine-readable medium of claim 16, wherein separating each data comprising dividing each data into two equal lengths of bits, and wherein high order bits are in one portion and low order bits are in the other portion.

21. The non-transitory machine-readable medium of claim 16, wherein the first compression algorithm is a run-length compression algorithm.

22. The non-transitory machine-readable medium of claim 16, wherein the second compression algorithm is a deflate compression algorithm.

* * * * *